United States Patent [19]

Karabatsos et al.

[11] Patent Number: 5,469,330
[45] Date of Patent: Nov. 21, 1995

[54] HEAT SINK HEADER ASSEMBLY

[76] Inventors: Chris Karabatsos, 42 Jumping Brook La., Kingston, N.Y. 12401; Gary W. Smith, 12376 Darkwood Rd., San Diego, Calif. 92129

[21] Appl. No.: 448,324

[22] Filed: May 23, 1995

Related U.S. Application Data

[63] Continuation of Ser. No. 195,212, Feb. 14, 1994, abandoned.

[51] Int. Cl.⁶ .................................................... H05H 7/20
[52] U.S. Cl. ......................... 361/704; 165/185; 257/706; 257/720; 361/785; 439/487
[58] Field of Search ............................... 165/80.2, 80.3, 165/185; 174/16.3; 257/701, 706, 712, 713, 720; 361/704, 707, 709–710, 712, 719–720, 735, 743–745, 767, 785, 790–791, 808; 439/485, 487

[56] References Cited

U.S. PATENT DOCUMENTS

| | | | |
|---|---|---|---|
| 3,325,766 | 6/1967 | Kolb et al. | 439/485 |
| 3,917,375 | 11/1975 | Johnson | 439/487 |
| 4,082,407 | 4/1978 | Smorzaniuk et al. | 439/487 |

*Primary Examiner*—Gregory D. Thompson
*Attorney, Agent, or Firm*—John J. Murphey

[57] ABSTRACT

In a header assembly, for interconnecting an electronic module to a mother board, including an insulating strip and at least one row of spaced-apart pins inserted through holes between an upper face and a lower face of the strip, each of the pins having an upper portion projecting from the upper face and being shaped and dimensioned to interconnect with the module, and a lower portion projecting from the lower face and being shaped and dimensioned to interconnect with the mother board, any adjacent two of the pins being separated by a length of the strip, the improvement which includes a plurality of collars of heat-dissipating material, one of the collars mounted around and in intimate contact with each of the pins, the collars having a peripheral outline shaped and dimensioned to avoid electrical contact with an adjacent pin.

21 Claims, 2 Drawing Sheets

HEAT SINK HEADER ASSEMBLY

RELATION TO OTHER APPLICATIONS

This application is a continuation of previous patent application, Ser. No. 08/195,212, filed Feb. 14, 1994, now abandoned entitled HEAT SINK HEADER ASSEMBLY, for inventor Gary W. Smith. The inventors of this continuation application are Chris Karabatsos, U.S. citizen, residing at 42 Jumping Brook Lane., Kingston, N.Y. 12401, and Gary W. Smith, U.S. citizen, residing at 12376 Darkwood Road, San Diego, Calif. 92129

BACKGROUND OF THE INVENTION

FIELD OF THE INVENTION

This invention relates to electronic hardware component structural design and more particularly to headers for attaching component modules to a mother board.

Electronic components are typically manufactured in the form of electronic subassemblies called modules which are later electrically and mechanically connected to a larger circuitboard or mother board for use in electronic systems. Many of these modules require interconnect devices referred to as header assemblies in order to connect the modules to the mother board. These interconnect devices are used today in the electronic industry for such applications as SIP (single inline packages) and ZIPS (zigzag inline packages). Headers are supplied by companies such as NAS and others.

FIG. 1 shows a perspective view of the relevant structures described above. A module 1 in this case is a small circuit board having a plurality of electronic devices attached to it. The devices can be packaged integrated circuit chips 2 and/or discrete devices 3 such as individual resistors, transistors and diodes. Currently, many integrated circuits are themselves packaged as modules which may connect directly to the header. These components will also benefit from improved header design.

Each module has a series of conductive contact pads 4 which form the electrical (and usually mechanical) connection points between the module and the rest of the system. The contact pads are typically soldered to pins 5 extending from one side of a header body or strip 6. The pins also extend from the bottom side of the header strip and are positioned to insert through holes 7 in the mother board 8. During the reflow process, the pins are soldered to the mother board.

Certain problems occur using the currently available header designs. During reflow, molten solder necessarily contacts the lower end of the pins to electrically connect them to the mother board. Heat from this molten solder travels up the pin to heat any structures which are connected to the pin. This includes the header strip, the solder connection between the top of the pin and the module pads and structures further within the module. If it is hot enough, some plastic or solder structures may melt. This can cause corruptions of header and module structures resulting in device failures.

Corruptions can include desoldering, where molten solder flows or is jarred away from its proper position. This problem is most frequently observed at the pin/module pad solder connection points. During reflow, either gravity or other mechanical acceleration caused by shock or vibration dislodges enough molten solder from the pad region to cause an open circuit. Sometimes, pad and pin are slightly biased away from each other such that when the solder becomes fluid, the pin may spring away from the pad creating an open circuit. The molten solder, as it changes position can also form shorts with adjacent areas.

Other corruptions can occur as cold solder joints. In this case, the remaining solder, when it cools, may not be strong enough to maintain an adequately conductive connection. When the completed system is subjected to its operational environment, the electrical connection may fail.

Corruption is not restricted to the pad/pin solder connection. Heat may continue traveling along any thermally conductive path damaging other solder connections 9 existing on the module. Heat from reflow can even damage the module deices themselves.

Another possible corruption is the partial melting of the header strip plastic during reflow which allows the pin to shift position within the strip. When the strip cool and hardens, the pins may be positioned out of alignment. Depending on the header design, this form of corruption can be very widespread.

Generally, there are two types of header designs. FIG. 2 shows a cross-section of a Type-I header having a plastic body or strip 6 with a series of slats or holes through which pins 5 are inserted. The strip is usually made of a glass-filled thermal plastic or liquid crystal polymer and the conductive metal pins are usually cold-stamped from a leadframe and machine inserted. This type of header is very susceptible to reflow corruption because: 1) the pins may not rigidly held in position within the strip in the first place; and 2) a significant surface area of the pin is in intimate contact with the strip, allowing transmission of heat to the strip.

FIG. 3 shows a second type of header (Type-II) where the header strip 6 is made of an epoxy glass material which is much less susceptible to heat damage and the pins 11, 12 and 13 are made of varying shapes with features which provide more rigid positioning within strip holes 14, 15, 16 and 17. The first pin 11 has a swage 18 with a star-like cross-section. The lateral dimensions of the swage are slightly greater than the diameter of the hole 14 in the strip. Since the strip material is somewhat resilient, the hole slightly gives way as the pin is inserted, tightly gripping the pin.

Pins and holes having other shapes operate in the same manner. A pin 12 having a rectangular cross-section may be inserted in star shaped 15 or round 16 holes to provide a tighter fit. A pin 13 having a rounded cross-section and a tapered or widened swage 19 may be inserted into star shaped, round or square 17 type holes. The workable combinations of pin, swage and hole shapes are myriad.

Although the Type-II style headers have much more rigid pin header connections, they too suffer from some pin position shifting and transmitting heat to the module during reflow. Even spring contact type headers, as seen in FIG. 4, which do not form a solder connection between the pins and module can suffer from this problem. Type-II style headers may also be susceptible to pin position shifting because of the reduced surface area of the pin in contact with the strip allows any melting to result in a greater shift.

It would be advantageous, therefore, to have a header which prevents heat corruption of header, module and their interconnection during the reflow process.

SUMMARY OF THE INVENTION

The primary and secondary objects of this invention are to provide a header which prevents corruption of pin-to-module connection points and heat damage to the header and/or module during the reflow process of soldering the pins to a mother board.

These and other objects are achieved by a heat dissipating land or collar for each pin integral with the header. Each collar intimately contacts its pin separately at some point as the pin traverses through the header. Heat generated from the reflow process will be trapped within the heat collars and be prevented from heating up the solder connection points between the pins and the module pads.

DESCRIPTION OF THE PREFERRED EMBODIMENTS

Figure 1:
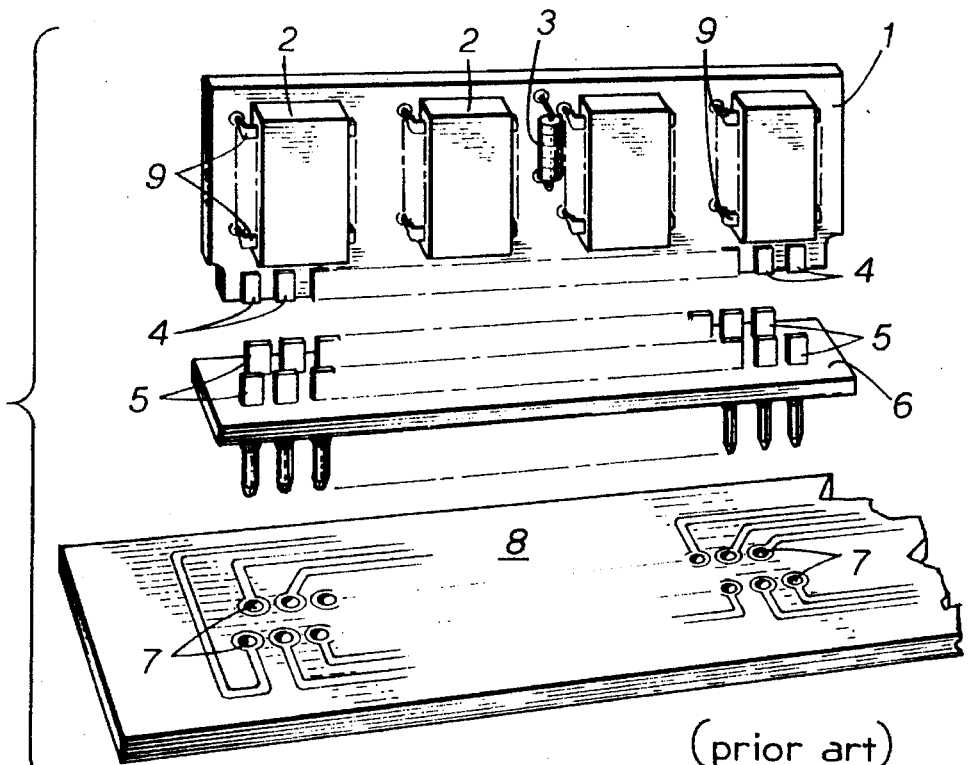
FIG. 1 is a prior art exploded perspective view of a module, header and mother board combination.
Figure 2:
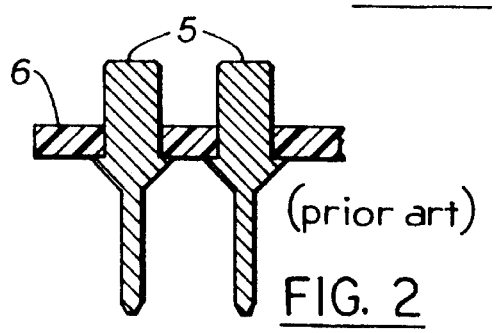
FIG. 2 is a prior art cross-sectional view of a Type-I header strip with pins engaged.
Figure 3:
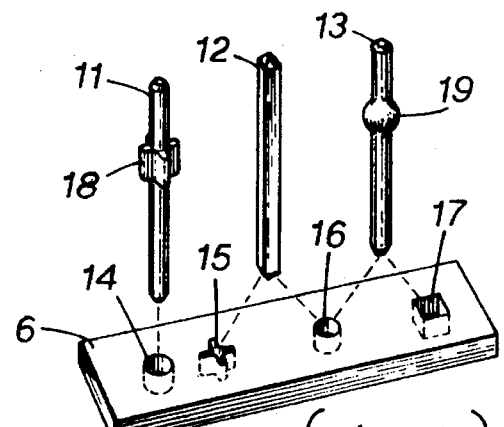
FIG. 3 is a prior art perspective view of a Type-II header strip proving for insertion of various pin designs.
Figure 4:
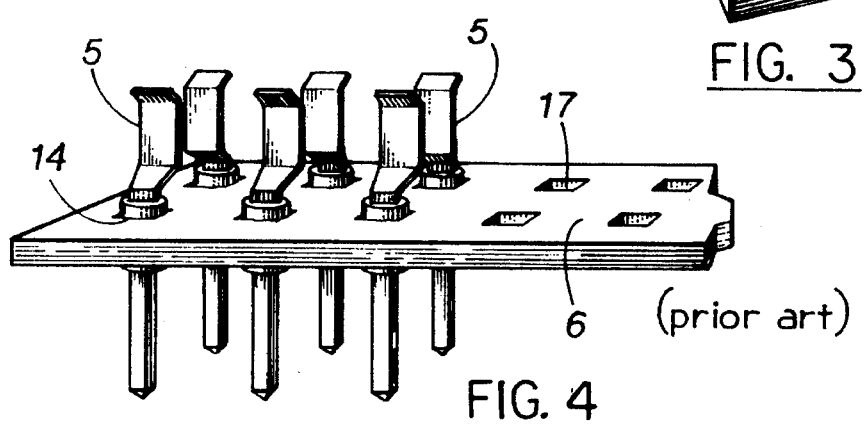
FIG. 4 is a prior art perspective view of a Type-II spring-pin type header.
Figure 5:
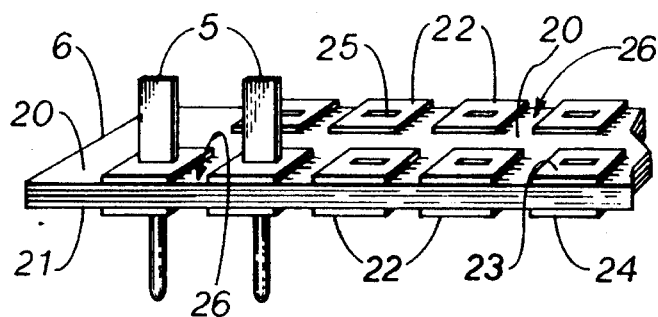
FIG. 5 is a perspective view of a Type-I header improved with separate heat-dissipation collars surrounding each pin hole.

Referring now to the drawings, FIG. 5 shows a perspective view of a header which comprises a main body or strip 6 made of insulating material such as epoxy glass, glass-filled thermal plastic or other liquid crystal polymer. The oblong strip has an upper face 20 and a lower face 21. Mounted along the upper and lower faces are a row of heat dissipation lands or collars 22. Each collar can have an upper plate 23 and a lower plate 24. Each plate requires an aperture 25 in communication with a hole through the strip which has an opening in the upper face and an opening in the lower face. A plate portion of a collar extends radially away from the aperture across one face of the strip. Any two plates which engage different pins are electrically insulated from each other by a length of strip 26 and have a peripheral outline so as to avoid an electrical short between them.

The collars may be made of any heat conductive material which is capable of being mounted onto the strip material such as copper, silver, gold and aluminum. An inexpensive choice is copper which can be easily clad onto the strip and etched. In order to provide adequate heat sinking properties, the plate portion of each collar must be of sufficient thickness. Copper of 600 to 900 grams per square meter (2–3 oz./ft.$^2$) has been found to be more than adequate in most commercial header applications.

Inserted into each hole is a conductive pin 5 for electrically connecting a contact on the module to a contact on the mother board. Each pin is of course in intimate contact with its corresponding collar. It is apparent that there need not be a plate on both the upper face and the lower face of the strip. A plate on just one of the faces may suffice in some applications.

Figure 6:
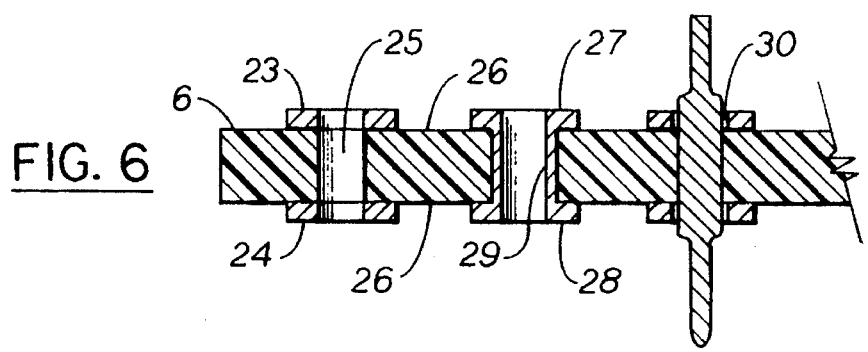
FIG. 6 is a cross-sectional view of a header strip with heat dissipation collars for each pin hole.

FIG. 6 shows a cross-section of the header strip. A first hole shows an upper plate 23 and a lower plate 24. Both plates together form the collar for that pin, however, the two plates are not physically connected with collar material. A second hole shows both upper 27 and lower 28 plates connected by a plated through tubular portion 29 lining the hole. The upper plate extends radially away from an upper end of the tubular portion, while the lower plate extends from a lower end of the same tubular portion. This structure ensures contact between the heat sink structure and the pin, and provides for more contact area. The third hole 30 shows precisely the problem which the plated through hole avoids. When the collar apertures are larger than the hole opening, the pin can be insulated from the collar.

Figure 7:
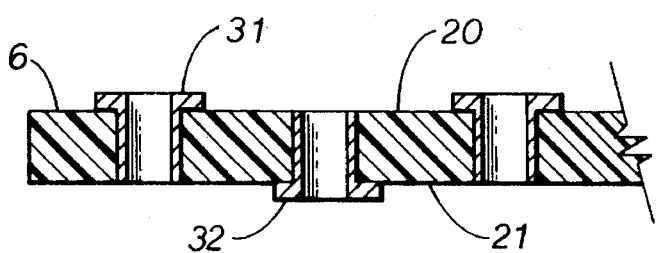
FIG. 7 is a cross-sectional view of a header strip with heat dissipation collars having plates which extend alternately across the top and bottom faces of the strip.

FIG. 7 shows that collars having one plate may position that plate alternatively across different faces from pin to pin. A first collar can have its plate 31 extend radially across the top face 20 of the header strip 6 and an adjacent collar will have its plate 32 extend radially across the bottom face 21. In this way width of a given plate may be greater.

Figure 8:
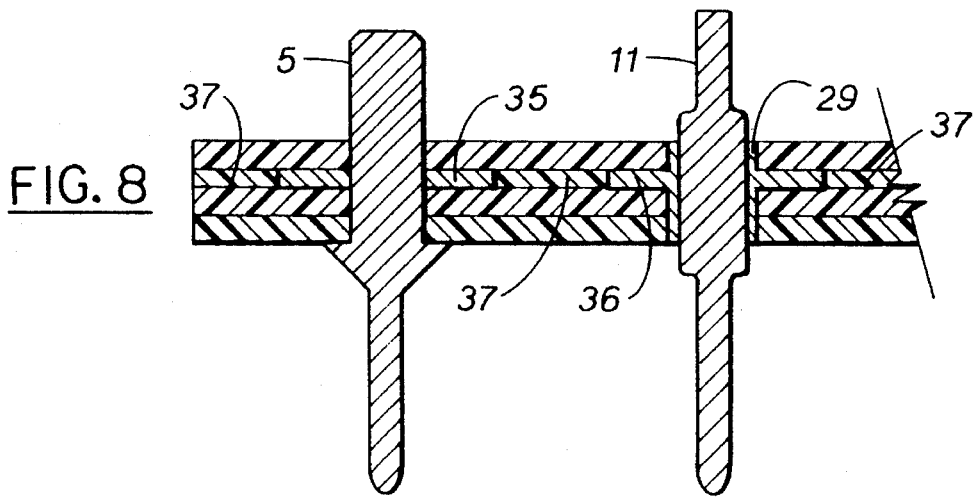
FIG. 8 is a cross-sectional view of a multi-layer header strip having dissipation collars with internal plates.

FIG. 8 shows the invention as it would be embodied in a multilayer header strip structure. This cross-sectional view shows an internal collar 35 contacting an inserted pin 5. As above, the hole in the strip may be plated through creating a tubular portion 29 to provide better contact with a pin 11. In this case the collar would connect to a medial part 36 of the tubular portion and extend into a medial layer 37 of the strip.

Figure 9:
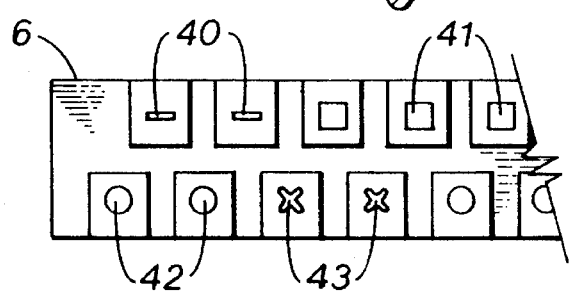
FIG. 9 is a plan view of a header strip having heat dissipation collars with various aperture shapes for accommodating various Type-I and Type-II pin designs.

FIG. 9 shows the various aperture shapes for heat dissipation collars which must accommodate pin designs from Type-I and Type-II headers. Collars can be simply made with slots 40 for Type-I style headers. For Type-II headers, the apertures can be square 41, round 42, star-shaped 43 or any popular shape.

A coating of acrylic or epoxy based solder mask material may be applied in liquid form or laminated to the exposed upper and lower surfaces of the header strip/collar combination structure to prevent bridging during reflow.

The heat dissipating collars may be formed through many different processes other than plating and etching. One method can involve creating molded plastic eyelets which are separately plated and then pressed onto the pins or attached to the header holes through some other means. Structures resulting from these methods do not necessarily depart from the structures claimed in this invention.

While the preferred embodiments of the invention have been described, modifications can be made and other embodiments may be devised without departing from the spirit of the invention and the scope of the appended claims.

What is claimed is:

1. In a header assembly, for interconnecting an electronic module to a mother board, comprising an insulating strip and at least one row of spaced-apart pins inserted through holes between an upper face and a lower face of said strip, each of said pins having an upper portion projecting from said upper face and being shaped and dimensioned to interconnect with said module, and a lower portion projecting from said lower face and being shaped and dimensioned to interconnect with said mother board, any adjacent two of said pins being separated by a length of said strip, the improvement which comprises:

a plurality of collars of heat-dissipating material, one of said collars mounted around and in intimate contact with each of said pins, said collars having an outline to avoid electrical contact with an adjacent pin.

2. The improvement of claim 1 wherein at least one of said collars includes a tubular portion lining one of said holes.

3. The improvement of claim 2 wherein said collar further includes a first planar portion extending radially from one end of said tubular portion and over a portion of one of said faces of said strip.

4. The improvement of claim 2 wherein said collar includes a first planar portion extending radially from a medial part of said tubular portion and through a section of a medial layer of said strip.

5. The improvement of claim 1 wherein at least one of said collars is made of a material including a metal selected from a group consisting of copper, silver, gold and aluminum.

6. The improvement of claim 1 wherein at least two of said collars include tubular portions, each said tubular portion lining a separate one of said holes, and further including first planar portions extending radially from opposite ends of said tubular portions over opposite faces of said strip.

7. The improvement of claim 3 wherein said collar further includes a second planar portion extending radially from the other end of said tubular portion and over a portion of the other said face of said strip.

8. In a header assembly, for interconnecting an electronically module to a mother board, comprising an insulating strap and at least one row of spaced-apart pins inserted through holes between an upper face and a lower face of said strip, each of said pins having an upper portion projecting from said upper face and being shaped and dimensioned to interconnect with said module, and a lower portion projecting from said lower face and being shaped and dimensioned to interconnect with said mother board, any adjacent two of said pins being separated by a length of said strip, the improvement which comprises:

a plurality of collars of heat-dissipating material, one of said collars mounted around and in intimate contact with each of said pins, said collars having a peripheral outline to avoid electrical contact with an adjacent pin.

9. The improvement of claim 8 wherein at least one of said collars includes a tubular portion lining one of said holes.

10. The improvement of claim 9 wherein said collar further includes a first planar portion extending radially from one end of said tubular portion and over a portion of one of said faces of said strip.

11. The improvement of claim 9 wherein said collar includes a first planar portion extending radially from a medial part of said tubular portion and through a section of a medial layer of said strip.

12. The improvement of claim 8 wherein at least one of said collars is made of a material including a metal selected from a group consisting of copper, silver, gold and aluminum.

13. The improvement of claim 8 wherein at least two of said collars include tubular portions, each said tubular portion lining a separate one of said holes, and further including first planar portions extending radially from opposite ends of said tubular portions over opposite faces of said strip.

14. The improvement of claim 11 wherein said collar further includes a second planar portion extending radially from the other end of said tubular portion and over a portion of the other said face of said strip.

15. In a header assembly, for interconnecting an electronic module to a mother board, comprising an insulating strip and at least one row of spaced-apart pins inserted through holes between an upper face and a lower face of said strip, each of said pins having an upper portion projecting from said upper face and being shaped and dimensioned to interconnect with said module, and a lower portion projecting from said lower face and being shaped and dimensioned to interconnect with said mother board, any adjacent two of said pins being separated by a length of said strip, the improvement which comprises:

a plurality of collars of heat-dissipating material, one of said collars mounted around and in intimate contact with each of said pins, said collars having a peripheral outline shaped and dimensioned to avoid electrical contact with an adjacent pin.

16. The improvement of claim 15 wherein at least one of said collars includes a tubular portion lining one of said holes.

17. The improvement of claim 15 wherein at least one of said collars further includes a first planar portion extending radially from one end of said tubular portion and over a portion of one of said faces of said strip.

18. The improvement of claim 15 wherein at least one of said collars includes a first planar portion extending radially from a medial part of said tubular portion and through a section of a medial layer of said strip.

19. The improvement of claim 15 wherein at least one of said collars is made of a material including a metal selected from a group consisting of copper, silver, gold and aluminum.

20. The improvement of claim 15 wherein at least two of said collars include tubular portions, each said tubular portion lining a separate one of said holes, and further including first planar portions extending radially from opposite ends of said tubular portions over opposite faces of said strip.

21. The improvement of claim 18 wherein said collar further includes a second planar portion extending radially from the other end of said tubular portion and over a portion of the other said face of said strip.

* * * * *